United States Patent [19]

Roecks

[11] Patent Number: 4,469,268
[45] Date of Patent: Sep. 4, 1984

[54] PNEUMATIC FEED SYSTEM FOR AXIAL LEAD COMPONENTS

[75] Inventor: Carl C. Roecks, Palos Verdes Est., Calif.

[73] Assignee: Amistar Corporation, Torrance, Calif.

[21] Appl. No.: 349,634

[22] Filed: Feb. 17, 1982

[51] Int. Cl.³ .................. H05R 3/32; B25G 51/02
[52] U.S. Cl. .................. 227/76; 29/239; 227/112; 406/79
[58] Field of Search ........... 29/239, 741; 83/98, 83/99, 100, 409; 227/112, 76; 406/79, 51, 78, 77, 108

[56] References Cited

U.S. PATENT DOCUMENTS

| 2,887,685 | 5/1959 | Cast | 227/112 X |
| 3,074,660 | 1/1963 | Hawley | 242/118.3 |
| 3,351,388 | 11/1967 | Frank | 406/79 |
| 3,455,493 | 7/1969 | Ackermann et al. | 83/409 X |
| 3,658,230 | 4/1972 | Enock | 227/112 X |
| 4,286,201 | 8/1981 | Roecks et al. | 318/640 |
| 4,293,999 | 10/1981 | Woodman, Jr. | 29/741 X |
| 4,302,134 | 11/1981 | Johnson, Jr. et al. | 406/51 |
| 4,360,960 | 11/1982 | Patel | 29/239 |

*Primary Examiner*—Paul A. Bell
*Attorney, Agent, or Firm*—John Holtrichter, Jr.

[57] ABSTRACT

There is herein described a pneumatic feed or transport system for moving axial lead electronic components from one work station to another, such as from a lead cutting mechanism to a component inserting mechanism, for example.

9 Claims, 10 Drawing Figures

PNEUMATIC FEED SYSTEM FOR AXIAL LEAD COMPONENTS

TECHNICAL FIELD

This invention relates to the electronics manufacturing field and more particularly to systems which process and convey axial lead electronic components from one work station to another in a semi or fully automated machine handling such components.

BACKGROUND ART

Over the years, many means have been developed for transporting axial lead electronic components from one work station to another in automated machinery. For example, it is often required that individual ones of these electronic components are stripped from a reel supported roll which holds such components in spaced relationship by means of pairs of parallel tapes attached adjacent each end of the components. The leads are then cut to a desired length either before or after the component is transported to a lead-bending and insertion machine by a gravity feed chute or slide. Two such techniques are described in U.S. Pat. Nos. 4,196,512 and 4,286,201, assigned to the assignee of this invention.

The inventor of the present invention is also aware of an axial lead component transport scheme where there is provided mechanical means to push such components along a trough guide. This is described in U.S. Pat. No. 3,074,666. More recently, a technique has been described in U.S. Pat. No. 3,455,493 where an axial lead component insertion machine has been adapted for use in combination with a rather complicated mechanical endless component conveyor.

Although each of these techniques exhibit certain advantages, the inventor herein feels that his new technique which utilizes pneumatic pressure to force the axial lead components through a rigid or flexible conduit from one work station to another is most reliable and cost effective.

The inventor is also not aware of any mechanism which will simultaneously strip such components from tapes holding them and cut the leads to a desired length, in combination with a pneumatic transport means, as will be described in detail hereinafter. It should therefore be evident that such an axial lead electronic component transport means and cutter/loader combination will increase reliability and efficiency in the electronics manufacturing industry and, therefore, constitute a significant advancement in the art.

SUMMARY OF THE INVENTION

In view of the foregoing factors and conditions characteristic of the prior art, it is a primary object of the present invention to provide a new and improved pneumatic feed system for axial lead electronic components.

Another object of the present invention is to provide a more reliable and simple feed system for axial lead electronic components which utilizes pneumatic pressure to move the components from one work station to another.

Still another object of the present invention is to provide an axial lead electronic component work station which in one operation cuts the leads to a predetermined length and delivers the components to a transport mechanism.

Yet another object of the present invention is to provide an axial lead electronic component delivery system which utilizes a flexible delivery conduit.

In accordance with an embodiment of the present invention, an axial lead electronic component transport system includes an axial lead electronic component input station for accepting the electronic component, and an output station for receiving the electronic component from the input station. Also included is a conduit structure communicating with both the input and output stations, and pneumatic means operatively coupled to the input station and to the conduit structure for forcing the electronic component from the input station, through the conduit structure to the output station.

The invention may also include a combination cutter/loader input station which cuts the leads of the electronic component to a desired length and delivers the component to the transport structure, all in a single operation.

The features of the present invention which are believed to be novel are set forth with particularity in the appended claims. The present invention, both as to its organization and manner of operation and use, together with further objects and advantages thereof, may best be understood by making reference to the following description, taken in conjunction with the accompanying drawings in which like reference characters refer to like elements in the several views.

DESCRIPTION OF THE PREFERRED EMBODIMENT

Figure 1:
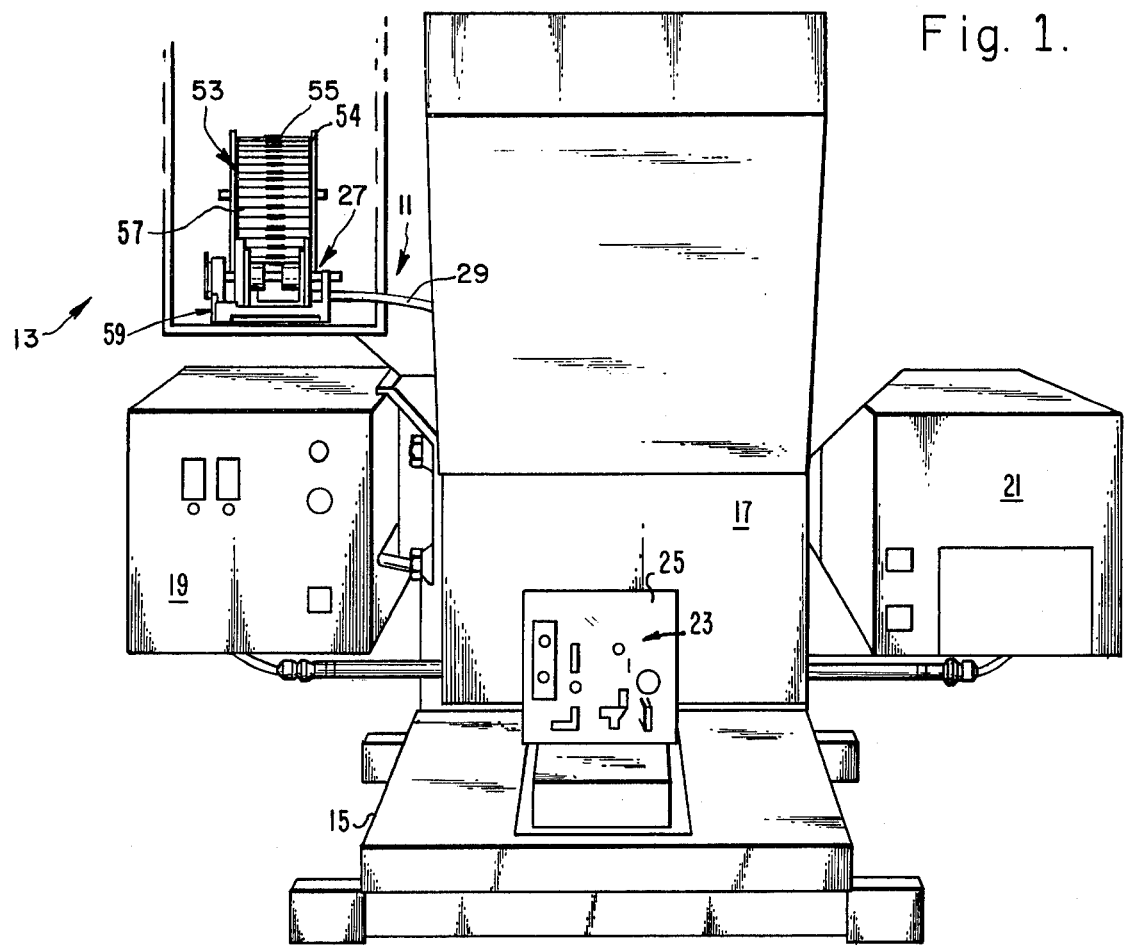
FIG. 1 is a perspective illustration of an axial lead electronic component system wherein the axial lead components are first cut from reel-supported rolls, then moved to a conveyor conduit and forced along the conduit by pneumatic means to a work station, in accordance with the present invention.

Referring now to the drawings and more particularly to FIG. 1, there is shown an axial lead electronic component system 11, in accordance with the present invention, and utilized in an electronic component printed circuit board insertion machine 13.

Here, the machine 13 includes a base 15, an upright housing 17 mounted on the base, conventional power control and automatic sequencing modules 19 and 21, respectively, and a conventional axial lead component inserting mechanism 23 disposed in the housing 17 behind a protective transparent window 25.

A plurality of component input stations 27 are provided so that a perforated circuit board, not shown, may be populated with several different types and values of axial lead electronic components in one operation. That is, the component inserter 23 may be fed various types of components from different input stations under control of a conventional programmed sequencer.

The various components are provided to the final work station 23 from the several input stations 27 by means of an associated conduit 29, which in this embodiment is a flexible tube. The radius of curvature of any bends in the conduit should, of course, be dimensioned to allow the free movement of axial lead components moving therealong.

The axial lead component input station 27 which functions to accept conventional component-holding rolls 53. These rolls include spaced tapes 54 that support spaced, parallel disposed axial lead electronic components 55 adjacent the ends of their oppositely extending leads 57 (see FIG. 4). The station 27 includes a frame 59 having a base portion 61 and opposite upwardly extending side portions 63.

On the side portions 63 of the frame 59, a horizontal plate or platform 65 is disposed. The platform arrangement may include fixed vertical side plates or the side plates 67 may have horizontal bottom portions 68 which are slidably held between the horizontal plate 65 and a fixed lower horizontal plate 69, also supported by the frame side portions 63.

A horizontal shaft 71 is rotatably mounted in the left side portion 63 by a conventional ball bearing assembly 73 or bushing mounted in the wall portion 63. The shaft fixedly supports a ratchet wheel 75 mounted outside the base side wall by an attached keyed collar 77, and also supports a pair of spaced component lead-engaging saw-tooth wheels 79 held in place by standard screw tightened collars 81.

Referring to FIGS. 2-5, it can be seen that the ratchet wheel 75, and consequently the two saw-tooth wheels 79, are caused to rotate in a clockwise direction (arrow 83) through the engagement into successive notches 85 in the wheel 75 by a spring-loaded pawl 87 pivotally mounted on an arm member 89 which is itself pivotally suspended from the shaft 71 between the left side wall portion 63 and the ratchet wheel 75. The rotational force on the pawl 87 is provided by a wire spring 91 which forces the portion of the pawl disposed to the left of the pivot pin 93 to move toward and enter a ratchet notch 85.

Figure 5:
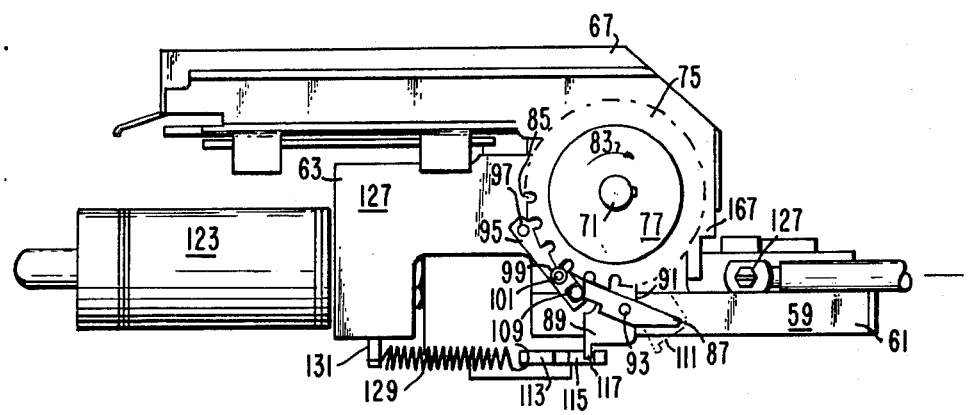
FIG. 5 is a left side elevational view of the mechanism of FIG. 3, and FIG. 5a an enlarged partial view of a portion of FIG. 5.
Figure 5A:
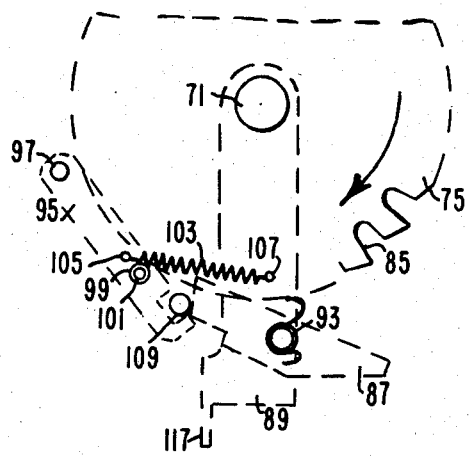

In order to allow for precise positioning of the ratchet wheel for each successive operation, a detent arrangement is provided. This consists of a detent arm 95 pivotally mounted by pivot 97 on the left side wall portion, a detent roller 99 captured by arm-mounted pin 101, and a coil spring 103 anchored between an inwardly extending pin 105 on the arm 95 and a pin 107 outwardly extending from the outer surface of the side wall, as seen in FIG. 5a. The clockwise rotational movement of the arm 89 on which the pawl is mounted is limited by a limit pin 109 extending outwardly from the left side of the base portion 61.

The arm 89 has two extreme positions. The resting position is shown in FIG. 5, and an actuated position shown by dashed outline 111. The arm 89 is forced to move between these two positions by the movement of an actuator lever 113 having a notch 115 in which a downwardly extending finger portion 117 of the arm 89 is captured.

Figure 6:
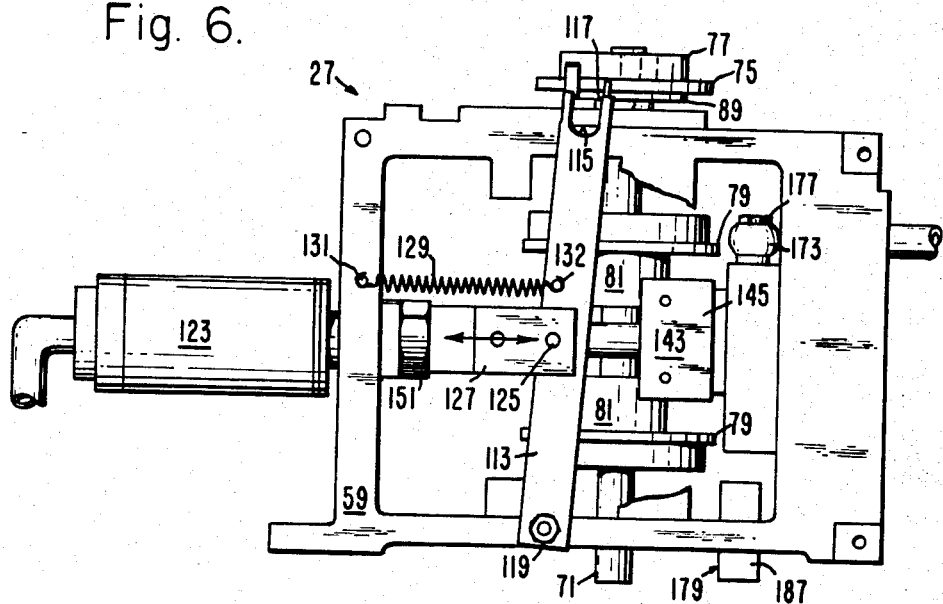
FIG. 6 is a bottom plan view of the mechanism of FIG. 4.

As best viewed in FIG. 6, the actuator lever 113 is pivotally mounted on the right underside of the frame 59 by a pivot pin 119, and this lever is pushed from its resting position (as shown in FIG. 6) to its cutting/loading position by axial movement of an actuator rod 121 (FIG. 8) of an actuator 123 pivotally coupled to the lever 113 by a pin 125 seated in a rod-mounted bracket 127. The pin 125 extends through an appropriately dimensioned hole in the actuator lever 113, which lever resides in a slot provided in the bracket 127. Upon de-actuation of the actuator 123, a return spring 129, anchored to the bottom of the frame by anchor pin 131 and to a hole 132 in the lever 113 at its other end, forces the lever to return to its resting position.

By this lever movement, it can be seen that the upper end of the spring-loaded pawl 87 will move to the right (FIG. 5) out of a particular ratchet notch 85 to a point where, when the actuator 123 is de-actuated and the lever 113 moves to the left, the upper end of the pawl will enter the next notch to the right of the one it just left and will push the ratchet wheel 75 in a clockwise direction. The pushing action of the pawl 87 does not itself determine the new final resting position of the ratchet wheel. Rather it is the action of the detent roller 99 mounted on the spring-loaded detent arm 95 that forces the ratchet wheel to move to a predetermined resting rotational position relative to the frame by partially entering one of the symmetrically disposed ratchet notches 85.

It should now be clear that there has been provided a mechanism that advances or rotationally moves the teeth in the saw-tooth wheels 79 in predetermined steps or increments in response to each actuation/de-actuation function of the actuator 123.

Figure 4:
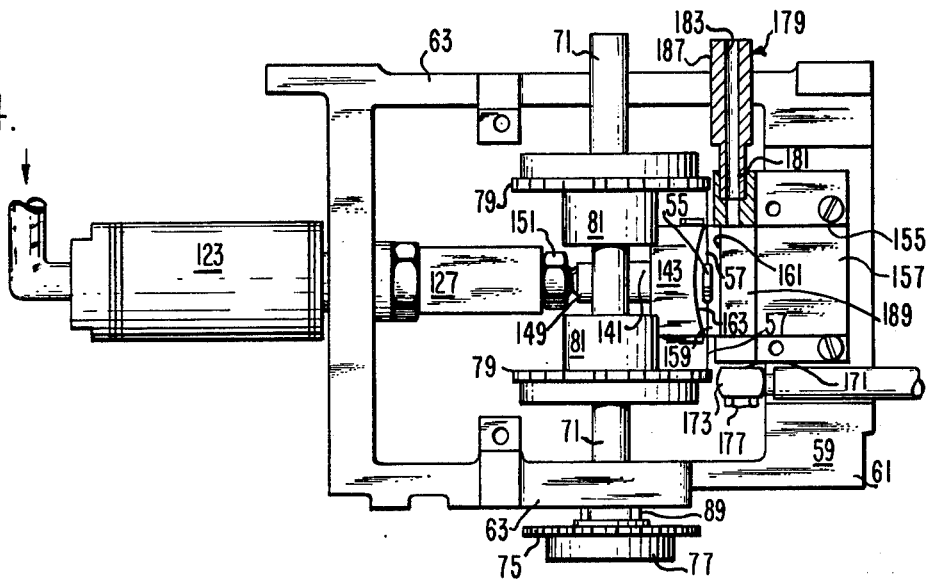
FIG. 4 is a top plan view of the mechanism of FIG. 3, with its roll guide plates removed.
Figure 3:
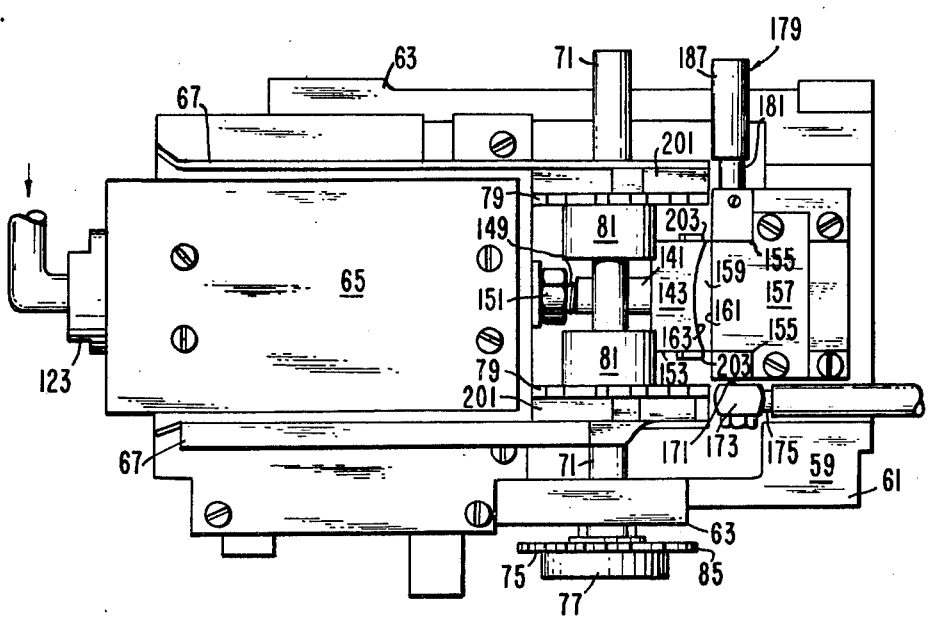
FIG. 3 is a top plan view of the mechanism shown in FIG. 2.

Further, as can best be viewed in FIGS. 3 and 4, an attachment arm 141 of a movable cutter member 143 is fixedly attached to the actuator rod 121. Preferably, the axial position of a cutter head portion 145 of the member 143, relative to the rod 121, is adjustable. This is accomplished in the presently described embodiment of the invention by using an attachment arm 141 that has a shank portion 147 pivotally attached to the head portion 145, and a threaded reduced diameter shank portion 149 threadably engaged in a suitably threaded hole in the end of the actuator arm-mounted bracket 127. The shank portion 149 may then be rotated to move either into or out of the bracket 127 and then be locked in place by a lock nut 151.

Figure 2:
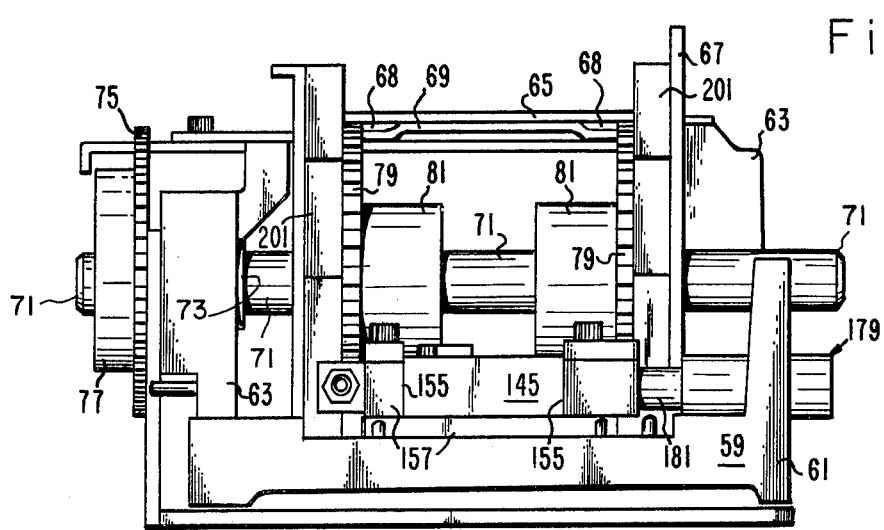
FIG. 2 is a front elevational view of the cutter/pneumatic conveyor mechanism shown in FIG. 1.

The side 153 of the head portion 145 are in slidable contact with the inner side walls 155 of a matting frame-mounted stationary cutting head member 157, best viewed in FIGS. 2-4. The head portion 145 includes a transverse channel 159 having a straight front wall 161, a concave rear wall 163, and open ends 165.

In the resting configuration of the device as shown in FIGS. 3 and 4, for example, the longitudinal axis of the channel 159 is not obstructed by the walls of the cutting head member 157, and freely extends between the inner walls of the lower extremities 167 of the side plates 67 (FIG. 5). However, as the head portion 145 is moved by the actuator action toward its ultimate actuated position, the walls 155 of the stationary cutting head member 157 seals off the channel 159 and restricts its length to the distance between the side walls 155.

Finally, when the actuator is fully extended, the longitudinal axis of the channel or trough 159 is in line with the axis of an outlet port 171 of a pneumatic header 173 having a conventional flexible tube attachment fitting 175. The header may, for example, be fixedly attached to the stationary cutting head member 157 by a machine screw 177. Also in line with the axis of the channel 159 at this point is an outlet header member 179, here shown having a reduced diameter inner portion 181 pressed into a hole extending to the inner wall surface 155. The header 179 is provided with an elongated hole 183 which is in coaxial alignment with the longitudinal axis of the channel 159 when the movable cutting head is in its extended position.

Thus, if a gas such as air is forced through the inlet header 173 while the head is in this configuration, the gas will be able to travel the length of the trough 159 and thereafter through the hole 183 in the outlet header 179 and through a conduit such as a flexible pipe 185 clamped, for example, to the outlet end 187 of the outlet header.

Upon being de-actuated, the actuator 123 and the return spring 129 will force the actuator rod and the movable cutter member 143 rearwardly. This action moves the forward body portion 189 of the cutter member 143 into a position which effectively seals off the gas inlet port leading to the cutter head member, and very little, if any, gas will escape from the system.

In operation, the outer and end portion of a component-holding roll is dressed downwardly along the front portion of the sawtooth wheels 75, behind curved side guides 201 are mounted on the side plates 67, and in front of a pair of inner guides 203. This structure is provided to help maintain a uniform configuration of the spaced parallel axial lead components before being cut and loaded in the conveyor arrangement.

The spacing between adjacent teeth in the sawtooth wheels 79 match the distance between the components as held in place by the tapes 54. Thus, the leads of about six components are always held by the wheels 79. The function of these wheels, as rotated by the actuator 123 through the movement of the lever 113, the pawl 87 and the ratchet wheel 75, is to provide a positive force on the components held by the tapes of the roll and to move the components sequentially into position within the longitudinal channel 159.

Figure 7:
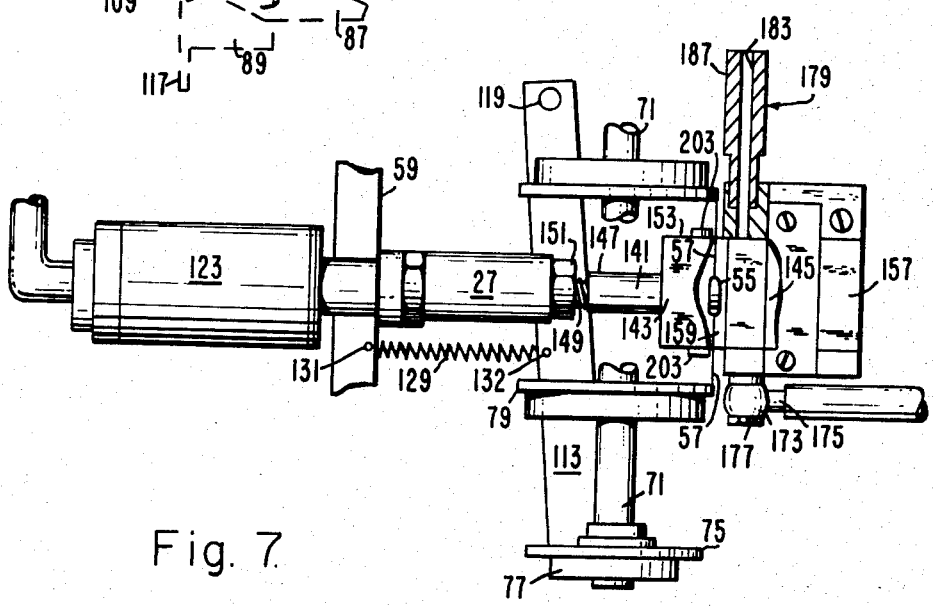
FIGS. 7–9 are top plan views of those portions of the mechanism shown in FIG. 4 which function to cut an axial lead component from a roll of taped components, align the component with the transport conduit, and force the component to travel along the conduit to the next work station.
Figure 8:
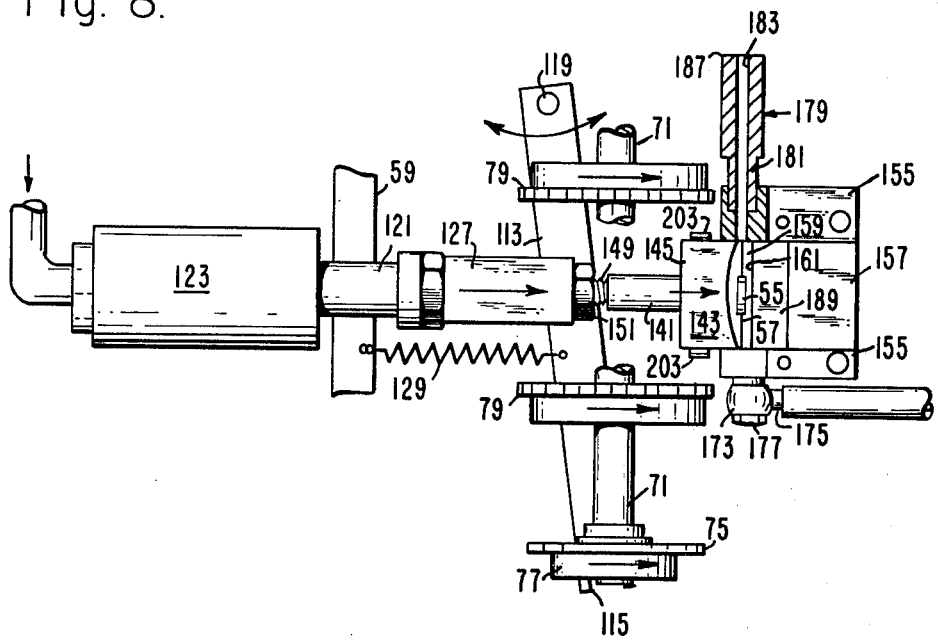
Figure 9:
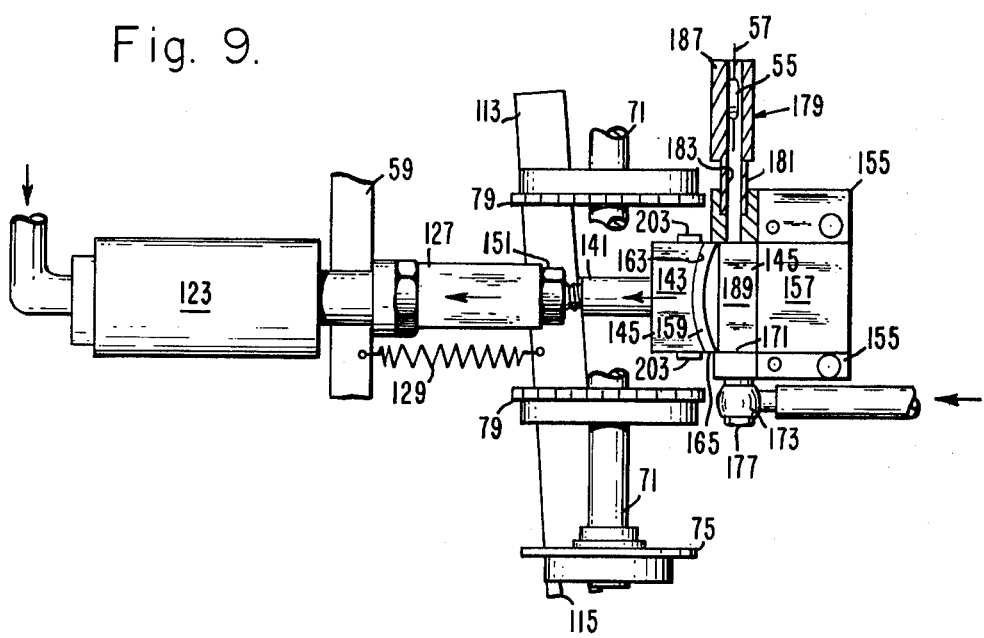

The components are deposited one at a time into the channel just as the movable cutter member 143 is pulled back to its resting position. At this point, the component in the channel is still held by the tapes of the roll, as seen in FIGS. 4 and 7. Upon operation of the actuator by the introduction of air pressure to the actuator 123, for example, the cutter member 143 is forced to move forward. This action first causes the leads 57 to be cut by the outer edges of the channel's concave rear wall 163 and the rear edges of the stationary head inner side walls 155. Then, as the forward movement of the cutter member 143 is completed, the outlet port 171 of the header 173 is exposed to the channel, allowing the gas under pressure to push the now trimmed axial lead component 55 into the elongated hole 183 and through the tube 29 to the component inserting mechanism 23, as shown in FIGS. 8 and 9.

From the foregoing it should be evident that there has herein been described a new and improved pneumatic feed system for axial lead electronic components that is more reliable than previous such systems and which utilizes pneumatic pressure to move the components from one work station to another. There has also been described an axial lead electronics work station which, in one operation, cuts the component leads to a desired length and delivers the components to a transport mechanism.

Although the invention has been described in detail with respect to presently preferred embodiments of the invention, it should be understood that the invention may be practiced using different and/or additional elements. For example, the conduit may be rigid as well as flexible, and the axial lead components may be cut from tapes stored in bandolier fashion in "amo" boxes instead of in reel-held rolls. Also, means other than the ratchet wheel and detent combination may be utilized in order to provide accurate advancement of the component feed mechanism.

1. An axial lead electronic component transport system, the system including:
   an axial lead electronic component input station for accepting said electronic component;
   an axial lead electronic component output station for receiving said electronic component from said input station;
   conduit structure communicating with both said input and output stations, said input station including structure which cuts the leads of said component to a desired length and conveys said component to said conduit structure in a single operation; and
   pneumatic means operatively coupled to said input station and to said condit structure for forcing said electronic component from said input station to said output station.

2. The axial lead electronic component transport system according to claim 1, wherein said axial lead electronic component input station includes a cutter/loader mechanism having a movable lead cutting member that in one movement cuts said axial leads to a desired length and moves said electronic component to a position in line with said conduit structure.

3. The axial lead electronic component transport system according to claim 2, wherein said cutter/loader mechanism also includes a taped component engagement structure pulling said components into said movable lead cutting member.

4. The axial lead electronic component transport system according to claim 3, wherein said cutter/loader mechanism also includes an actuator, and wherein said component engagement structure and said movable lead cutting member are operatively coupled together and to said actuator.

5. The axial lead electronic component transport system according to claim 3, wherein said cutter/loader mechanism includes detent structure operatively coupled to said component engagement structure positively registering therewith accurately sequentially positioning said components with respect to said movable lead cutting member.

6. The axial lead electronic component transport system according to claim 2, wherein said cutter/loader mechanism includes a movable lead cutting member slidably mounted in a stationary lead cutting member; and includes a pneumatic header mounted on said stationary lead cutting member.

7. An axial lead electronic component transport system, the system including:
   an axial lead electronic component input station for accepting said electronic component, an axial lead electronic component output station for receiving said electronic componet from said input station, and conduit structure communicating with both said input and output stations, said input station including a cutter/loader mechanism having a movable lead cutting member that in one movement cuts said axial leads to a desired length and moves said electronic component to a position in line with said conduit structure, said cutter/loader mechanism also including a movable lead cutting member slidably mounted in a stationary lead cutting member and a pneumatic header mounted on said stationary lead cutting member, said movable lead cutting member including a component-acception channel and said header having an outlet port registering with said channel when said movable head is in a component delivery position after the leads of said component have been cut; and pneumatic means operatively coupled to said input station and to said conduit structure for forcing said electronic component from said input sation to said output station.

8. The axial lead electronic component transport system according to claim 7, wherein said cutter/loader mechanism further includes a component outlet port registering with said channel when said movable head is said component delivery position.

9. The axial lead electronic component transport system according to claim 7, wherein said outlet port of said pneumatic header is sealed off by said stationary lead cutting member when said movable head member is not it said component delivery position.

* * * * *